United States Patent
Ranganath

(10) Patent No.: US 7,502,567 B2
(45) Date of Patent: Mar. 10, 2009

(54) ELECTROABSORPTION-MODULATED FABRY-PEROT LASER AND METHODS OF MAKING THE SAME

(75) Inventor: Tirumala R. Ranganath, Palo Alto, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 354 days.

(21) Appl. No.: 10/867,853

(22) Filed: Jun. 15, 2004

(65) Prior Publication Data

US 2005/0276615 A1  Dec. 15, 2005

(51) Int. Cl.
*H04B 10/04* (2006.01)
*H01S 3/10* (2006.01)
*H01S 3/13* (2006.01)

(52) U.S. Cl. .................. 398/183; 398/182; 372/26; 372/29.02

(58) Field of Classification Search .............. 372/26, 372/29.02; 398/182–183
See application file for complete search history.

(56) References Cited

U.S. PATENT DOCUMENTS

| 5,040,863 | A | | 8/1991 | Kawakami et al. | |
|---|---|---|---|---|---|
| 5,463,705 | A | | 10/1995 | Clauberg et al. | |
| 5,663,824 | A | | 9/1997 | Koch et al. | |
| 5,936,763 | A | * | 8/1999 | Mitsuda et al. | 359/341.33 |
| 6,115,401 | A | * | 9/2000 | Scobey et al. | 372/100 |
| 6,275,317 | B1 | | 8/2001 | Doerr et al. | |
| 6,389,047 | B1 | * | 5/2002 | Fischer | 372/32 |
| 6,516,017 | B1 | * | 2/2003 | Matsumoto | 372/50.11 |
| 6,597,718 | B2 | * | 7/2003 | Tanbun-Ek et al. | 372/50.11 |
| 7,065,300 | B1 | * | 6/2006 | Walker | 398/135 |
| 7,120,183 | B2 | * | 10/2006 | Krasulick et al. | 372/50.1 |
| 2002/0009114 | A1 | * | 1/2002 | Tanbun-Ek et al. | 372/50 |
| 2003/0012244 | A1 | * | 1/2003 | Krasulick et al. | 372/50 |
| 2003/0030888 | A1 | | 2/2003 | Sakai et al. | |
| 2003/0165173 | A1 | * | 9/2003 | Helbing et al. | 372/50 |
| 2003/0185500 | A1 | * | 10/2003 | Fells | 385/24 |
| 2004/0032646 | A1 | * | 2/2004 | Koren et al. | 359/344 |
| 2004/0179852 | A1 | * | 9/2004 | Westbrook et al. | 398/183 |
| 2005/0018732 | A1 | * | 1/2005 | Bond et al. | 372/50 |

FOREIGN PATENT DOCUMENTS

JP        04099081 A   *  3/1992

* cited by examiner

*Primary Examiner*—Minsun Harvey
*Assistant Examiner*—Phillip Nguyen

(57) ABSTRACT

Electroabsorption-modulated Fabry-Perot lasers and methods of making the same are described. In one aspect, a light source includes a Fabry-Perot (FP) laser that is operable to generate multimode laser light, an electroabsorption modulator (EAM) that is configured to selectively absorb and transmit laser light traveling therethrough, and an optical isolator. The optical isolator is on an optical path between the FP laser and the EAM. The optical isolator is configured to transmit laser light traveling along the optical path from the FP laser to the EAM.

5 Claims, 6 Drawing Sheets

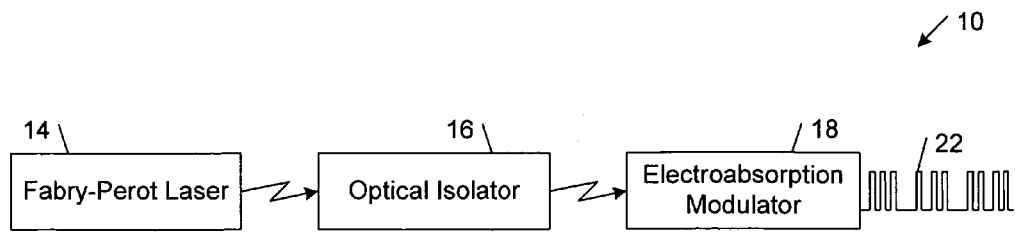
FIG. 1
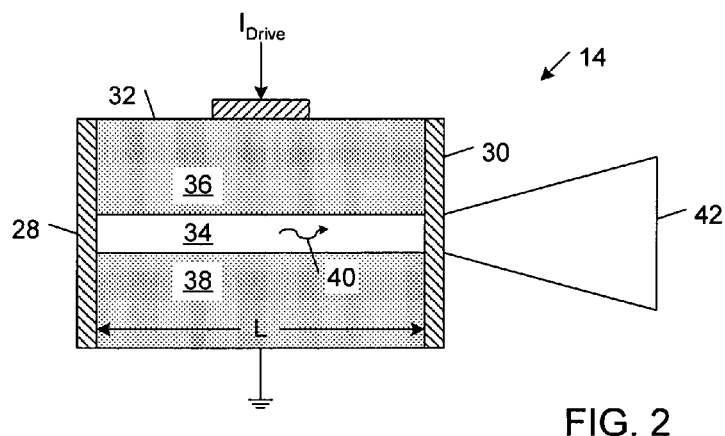
FIG. 2
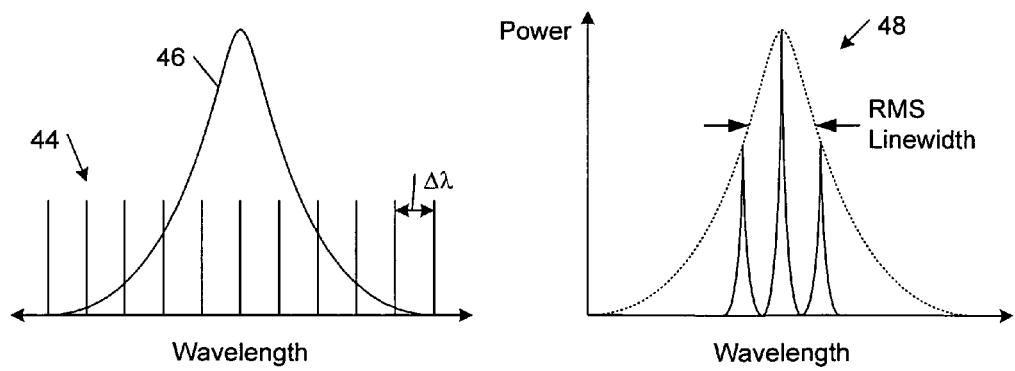
FIG. 3A
FIG. 3B

ELECTROABSORPTION-MODULATED FABRY-PEROT LASER AND METHODS OF MAKING THE SAME

BACKGROUND

Two general approaches typically are used to modulate the intensity of light: direct modulation and external modulation.

In a direct modulation approach, a laser (e.g., a laser diode) is directly modulated by an information signal to generate a modulated laser output. The laser output power often is modulated directly by modulating the input drive current to the laser. The laser begins lasing when the drive current exceeds a threshold current level. Typically, the modulation range of input drive current that is applied to a directly modulated laser extends above and near the threshold current level.

In an external modulation approach, a modulator modulates the intensity of light generated by a continuous wave laser in accordance with an information signal. The modulator and laser may be disposed on separate, discrete substrates or they may be fabricated together on a single substrate. External modulators fall into two main families: electro-optic type modulators, such as Mach-Zehnder type electro-optic modulators, which modulate light through destructive interference; and electro-absorption modulators, which modulate light by absorption (e.g., through the quantum-confined Stark effect).

Under direct modulation linear and nonlinear effects within the laser create chirp. Chirp is a variation in optical signal wavelength over the duration of a laser light pulse during modulation. For positive transient chirp, the leading edge of the laser light pulse comprises shorter wavelengths than the trailing edge. In positive dispersion fibers, shorter wavelengths travel faster than longer wavelengths. The pulse therefore broadens as it propagates. Regenerators often are required in order to compensate for this positive chirp, raising the cost of communications networks considerably. Chirp effects are manageable at direct laser modulation bit rates up to a few GHz. Direct modulation of lasers typically is not used at bit rates above a few GHz, especially when the laser is driven to create sharp laser pulses with abrupt rising and falling edges.

External modulation is favored for applications that are sensitive to chirp because external modulation introduces very little chirp into the output signal. For this reason, external modulation is used almost exclusively in long-distance digital optical communications, where excessive spectral broadening in a directly modulated laser due to chirp leads to a greater pulse distortion during propagation and a reduction in overall performance.

Distributed feedback (DFB) lasers are typically used for long-distance optical communication applications. A DFB laser produces an output that is characterized by a narrow spectral linewidth, which allows a DFB laser to transmit signals over long distances. This feature also allows a DFB laser to be used in narrow-linewidth applications, such as wavelength-division multiplexing (WDM) where it is desirable to carry as many multiplexed signals as possible without interference in the same optical fiber. DFB lasers, however, are extremely sensitive to back-reflections, which broaden the spectral linewidth and increase noise. For this reason, DFB lasers typically are assembled in one package with an optical isolator that blocks back-reflections.

The narrow linewidth features of DFB lasers and the low chirp characteristics of external modulators are leveraged in long-haul optical data transmission systems. The output wavelength temperature coefficient of a DFB laser and the absorption edge wavelength coefficient of an electroabsorption modulator, however, typically are significantly different, which degrades operation over wide temperature ranges. For this and other reasons, systems that include DFB lasers and electroabsorption modulators also typically include direct active temperature-regulating devices, such as thermoelectric coolers. In one such approach, a DFB laser and an electroabsorption modulator are mounted on an optical platform that is mounted on a submount, which is attached to a thermoelectric cooler. A thermistor mounted on the submount provides thermal feedback that allows the thermoelectric cooler to maintain the temperature of the DFB lasers and the electroabsorption modulators within a prescribed narrow temperature range.

For the reasons explained above, DFB laser designs tend to be bulky, expensive, and high in power consumption.

SUMMARY

In one aspect, the invention features a light source that includes a Fabry-Perot (FP) laser that is operable to generate multimode laser light, an electroabsorption modulator (EAM) that is configured to selectively absorb and transmit laser light traveling therethrough, and an optical isolator. The optical isolator is on an optical path between the FP laser and the EAM. The optical isolator is configured to transmit laser light traveling along the optical path from the FP laser to the EAM.

In another aspect, the invention features a method of making the above-described light source.

Other features and advantages of the invention will become apparent from the following description, including the drawings and the claims.

DESCRIPTION OF DRAWINGS

FIG. 1 is a block diagram of an embodiment of a light source that includes a Fabry-Perot laser, an optical isolator, and an electroabsorption modulator.

FIG. 2 is a diagrammatic view of an implementation of the Fabry-Perot laser of FIG. 1.

FIG. 3A is a graph of a set of exemplary optical longitudinal modes and an exemplary gain profile plotted as a function of wavelength for the Fabry-Perot laser implementation of FIG. 2.

FIG. 3B is a graph of the optical power spectrum plotted as a function of wavelength for the exemplary Fabry-Perot laser implementation of FIG. 3A.

DETAILED DESCRIPTION

Figure 4:
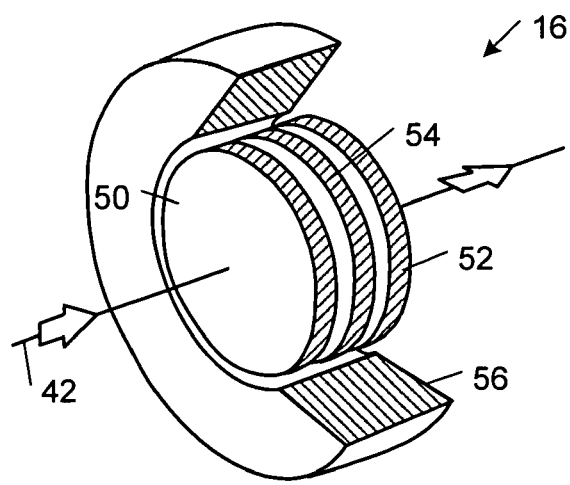
FIG. 4 is a diagrammatic view of an implementation of the optical isolator of FIG. 1.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

An FP laser produces an output that is characterized by a multiple longitudinal mode (or multimode) spectrum over a relatively wide spectral linewidth. The wide spectral linewidths of FP lasers preclude their use in long-haul data transmission applications and in narrow linewidth applications such as WDM. For example, the dispersion for each wavelength within the FP laser spectrum is different, giving rise to material dispersion that spreads the optical signal. In addition, FP lasers are characterized by mode hopping behavior, which gives rise to mode partition noise that causes phase jitter in the optical signal. The spectral linewidths of FP lasers also are too wide to be used in WDM applications without interference between the various longitudinal modes. For these reasons, the use of FP lasers hitherto has been limited to relatively short-distance applications that are not sensitive to chirp and where direct modulation techniques provide sufficient modulation rates.

In the light source embodiments described in detail below, the structural similarities between FP lasers and electroabsorption modulators are leveraged to enable high-speed light source designs that exhibit reliable and substantially temperature-independent data transmission capabilities over a wide temperature range. These designs therefore can omit direct active temperature regulating devices, such as thermoelectric coolers, which increase fabrication costs and operating costs. In this way, these embodiments enable practical light source designs that are characterized by high data rate, temperature-independent operation over short and medium distances.

FIG. 1 shows an embodiment of a light source 10 that includes a Fabry-Perot (FP) laser 14, an optical isolator 16, and an electroabsorption modulator 18. The light source 10 generates digital impulse output signals 22 that are encoded in accordance with any one of a wide variety of known optical communication protocols (e.g., amplitude shift keying (ASK) modulation, frequency shift keying (FSK) modulation, phase shift keying (PSK) modulation, and the like). In some embodiments, light source 10 generates digital impulse output signals 22 at bit rates ranging from approximately 1 gigabit per second (Gb/sec) up to approximately 50 Gb/sec over a wide range of operating temperatures.

FIG. 2 shows an implementation of FP laser 14 that includes first and second reflectors 28, 30 that define an optical resonant cavity 32. The optical resonant cavity 32 contains an active region 34 interposed between first and second cladding regions 36, 38. In the illustrated implementation, the first cladding region 36 is a semiconductor layer of material doped p-type, the second cladding region 38 is a semiconductor layer of material doped n-type, and the active region 34 is an undoped layer of semiconductor material. When a drive current ($I_{Drive}$) is applied to the FP laser 14, electron-hole pairs in the active region 34 combine to generate light 40. In some implementations, the active region 34 includes one or more quantum wells, which tailor the characteristics of the light 40 generated in the active region 34. The first and second reflectors 28, 30 are cleaved facets of semiconductor material. In the illustrated embodiment, the reflector 28 is 100% reflective of light 40 and the reflector 30 is partially reflective of light 40 so that polarized output light 42 exits the edge of the FP laser 14 corresponding to the partially reflective reflector 30.

The optical resonant cavity 32 limits light oscillation to a discrete set of evenly-spaced longitudinal optical modes 44 shown in FIG. 3A. The wavelength mode spacing ($\Delta\lambda$) of the output light 42 is given by $\Delta\lambda = C(2nL)^{-1}$, where C is the velocity of light, L is the length of cavity 32 and n is an effective refractive index of the medium for light propagation and n is a number greater than 1. The active region 34 is characterized by a gain versus wavelength function 46, which results in the amplification of only a limited number of optical modes (e.g., 3-30 modes) within a relatively narrow wavelength band. The output power spectrum 48 of the output light 42 generated by FP laser 14 is shown in FIG. 3B. The wavelength spectrum 48 is characterized by a root-mean-squared (RMS) linewidth that corresponds to the weighted mean of the square root of the sum of the squared magnitudes of the spectral components of the output light 42. Maintaining a relatively narrow spectral linewidth (though still not a single-mode spectrum) enables the light source 10 to reliably transmit output data signals 22 over longer distances. In some implementations, the RMS spectral linewidth is at most 3 nanometers (nm). In some of these implementations, the RMS spectral linewidth is at most 1 nm.

FIG. 4 shows an embodiment of optical isolator 16 that includes a pair of polarizers 50, 52 and a Faraday rotator 54 interposed between the polarizers 50, 52. In some implementations, the polarizers 50, 52 are birefringent prisms or polarizing beam splitters, and the Faraday rotator 54 is a magnetic garnet crystal. An annular permanent magnet 56 surrounds and applies a magnetic field to the Faraday rotator 54. In the illustrated embodiment, the polarizer 50 has a polarization axis that is oriented parallel to the polarization of the light 42 received from FP laser 14, the Faraday rotator 54 rotates the polarization of the light 45°, and the polarizer 52 has polarization axis that is oriented parallel to the rotated light received from the Faraday rotator 54. In this way, the polarized output light 42 received from FP laser 14 passes through the optical isolator without substantial amplitude reduction. Back-reflected light, on the other hand, passes through the Faraday rotator 54 twice and therefore has an orthogonal polarization relative to the polarization axis of the polarizer 50. For this reason, such back-reflected light is substantially blocked by the optical isolator 16. By preventing backreflections from reaching the FP laser 14, the optical isolator 16 prevents spectral broadening of the output data signals 22 that otherwise would occur and allows the light source 10 to produce output light signals 22 without substantial spectral broadening of the output light 42 generated by FP laser 14. In the illustrated embodiment, the polarization axis of polarizer 52 is oriented at an angle of 45° relative to the polarization axis of polarizer 50. In the illustrated embodiment, the electroabsorption modulator 18 is polarization-independent. In another embodiment, the optical isolator 16 is a polarization-maintaining isolator, in which the input and output polarization states are along the same axis. In this other embodiment, the electroabsorption modulator 18 may be polarization-independent or polarization-dependent (e.g., TE mode only).

Figure 5:
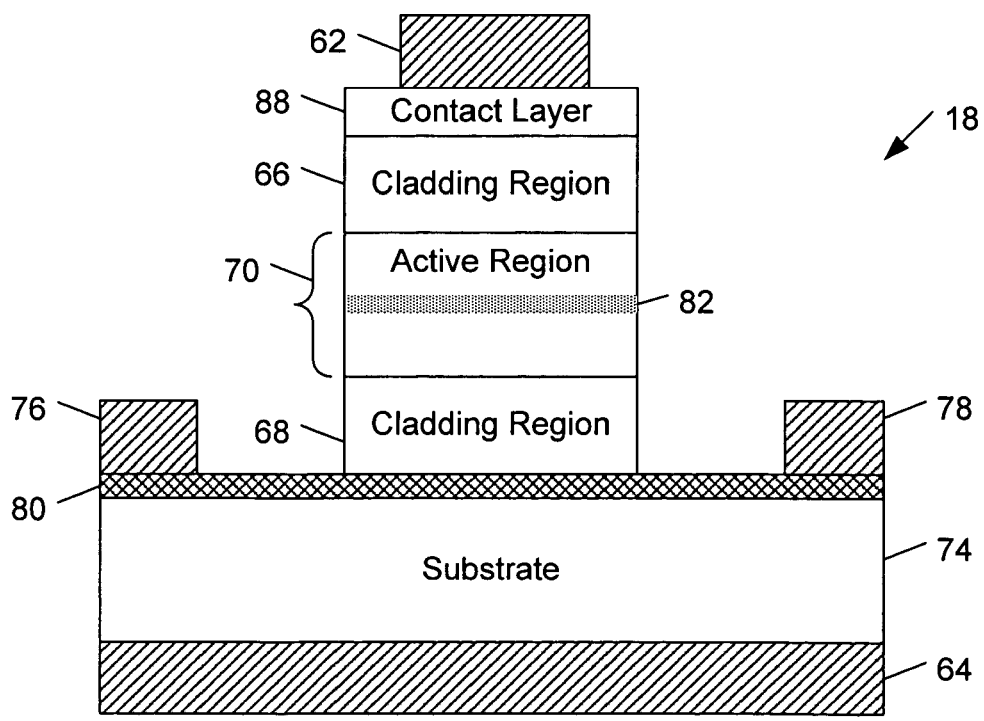
FIG. 5 is a diagrammatic side view of one possible implementation of embodiment of the electroabsorption modulator of FIG. 1.

FIG. 5 shows an embodiment of an electroabsorption modulator 18 that includes first and second electrodes 62, 64, first and second cladding regions 66, 68, and an active region 70.

Figure 6A:
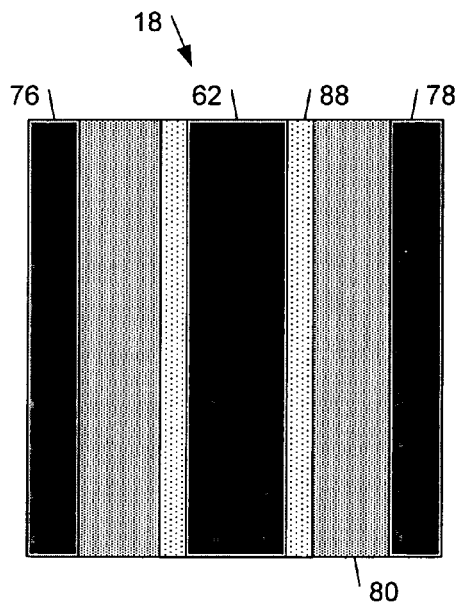
FIG. 6A is a top view of an implementation of the electroabsorption modulator embodiment of FIG. 5 that has a signal electrode formed from a continuous strip of electrically conductive material.
Figure 6B:
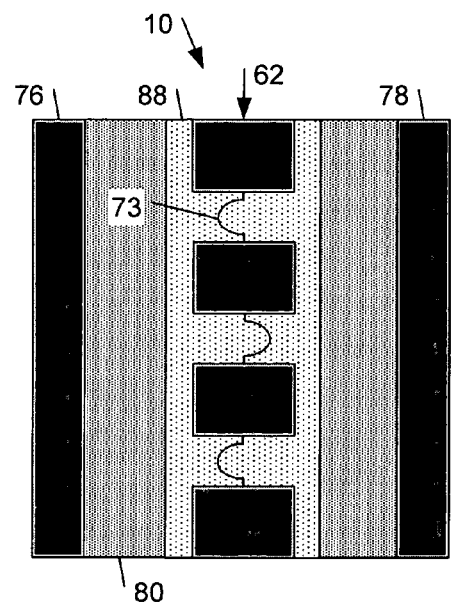
FIG. 6B is a top view of an implementation of the electroabsorption modulator embodiment of FIG. 5 that has a signal electrode formed from multiple spaced-apart electrode segments of electrically conductive material that are connected in series by inter-stage microstrip lines.

The first and second electrodes 62, 64 include one or more metal layers. In one exemplary embodiment, each of the first and second electrodes 62, 64 includes an underlying layer of titanium, which promotes adhesion and forms an ohmic contact interface between the electrodes 62, 64 and the supporting semiconductor material, and an overlying layer of gold that forms electrical contacts for the electroabsorption modulator 18. In the illustrated embodiment, the first electrode 62 is a traveling-wave signal electrode formed from a continuous strip of electrically conductive material, as shown in FIG. 6A, or from multiple spaced-apart electrode segments of electrically conductive material that are connected in series, with each pair of signal electrode segments connected by a respective inter-stage microstrip line 73, as shown in FIG. 6B.

In some implementations, the first and second electrodes 62, 64 are connected to input and output bonding pads by respective microstrip lines. The input bonding pad is connected to a drive circuit by a first bonding wire and the output bonding pad is connected to an external termination load through a second bonding wire. The electro-absorption modulator 18, the input and output bonding pads, and the input and output microstrip lines are fabricated on the same substrate 74 (e.g., a wafer of semiconductor material, such as InP or GaAs). The external termination load is any suitable termination load, such as a resistor. The termination load and the drive circuit typically are impedance-matched to reduce reflections and maximize the electrical voltage that can be delivered across the active region 70 of the electro-absorption modulator 18.

In the illustrated embodiment, the substrate 74 is electrically insulating and the electroabsorption modulator 18 and first and second metal film transmission lines 76, 78 are formed on an electrically conducting semiconductor layer 80 (e.g., n++InGaAs or n++InGaAsP), which is formed on the substrate 74. In other embodiments, the substrate 74 is electrically conducting, and the electroabsorption modulator 18 and the transmission lines 76, 78 are formed directly on the substrate 74.

Each of the first and second cladding regions 66, 68 and the active region 70 includes one or more semiconductor layers. In the illustrated embodiment, the first and second cladding regions 66, 68 are doped n-type and the active region is undoped and, therefore, contains relatively small amounts of impurities (e.g., less than about $5 \times 10^{15}$ cm$^{-3}$). The first and second cladding regions 66, 68 are formed of material compositions that have lower refractive indices than the material composition of the active region 70. In this way, the cladding regions 66, 68 and the active region 70 operate as a waveguide for light traveling through the electroabsorption modulator 18. The active region 70 includes a light absorption region 82 that includes at least one quantum well with a conduction band alignment and a valence band alignment that create bound electron and hole states that are involved in the electroabsorption process.

The implementation of electroabsorption modulator 18 shown in FIG. 5 corresponds to a ridge-type waveguide structure. In other embodiments, the electroabsorption modulator 10 may by implemented by different types of waveguide structures. For example, in some embodiments, the electroabsorption modulator 10 includes a buried heterostructure.

Figure 7:
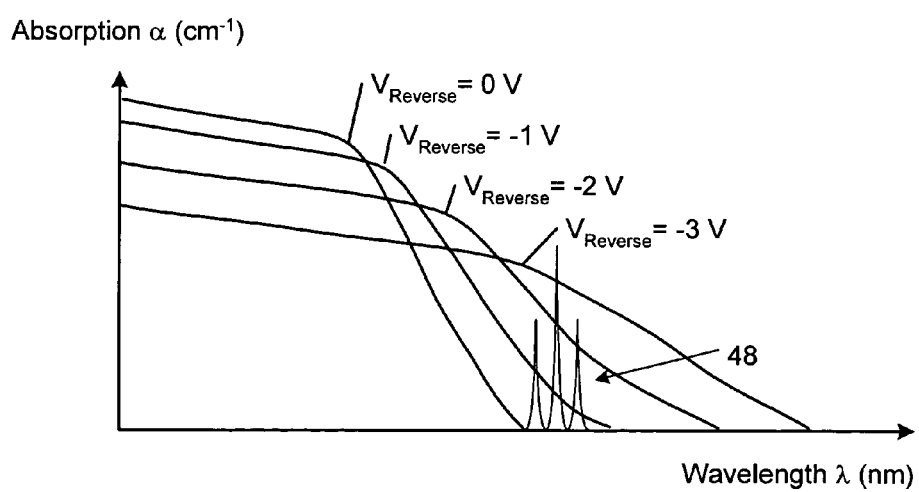
FIG. 7 is an illustrative graph of the absorption coefficient of the electroabsorption modulator implementation of FIG. 5 plotted as a function of wavelength for different bias conditions.

FIG. 7 shows a graph of the absorption spectrum of the electroabsorption modulator 18 under different bias conditions and the output spectrum 48 of the FP laser 14. As shown in FIG. 7, the absorption edge (corresponding to the "knee" in the absorption spectrum curves) of the electroabsorption modulator 18 moves to longer wavelengths with increasing applied reverse bias ($V_{Reverse}$). In some implementations, the zero-bias ($V_{Reverse}=0$) absorption edge wavelength of the electroabsorption modulator 18 is designed to be shorter than a specified target wavelength (e.g., the dominant peak) in the output spectrum 48 to be modulated. For example, in one exemplary implementation, the zero-bias ($V_{Reverse}=0$) absorption edge wavelength of the electroabsorption modulator 18 is approximately 50-70 nm shorter than a target lasing wavelength of approximately 1555 nm. As the reverse bias applied to the electroabsorption modulator 18 increases, the absorption edge wavelength shifts to longer wavelengths and the optical signal 22 emitted from the electroabsorption modulator 18 is reduced. The ratio of the "on" state to the "off" state is referred to as the extinction ratio of the electroabsorption modulator 18.

The optical isolation provided by the optical isolator 16 renders the light source 10 substantially immune to any reflections originating beyond the optical isolator 16. The spectrum and the amplitude of the output optical signal 22 are determined primarily by the ambient temperature, the drive current to the laser 14 and the voltage applied to the electroabsorption modulator 18. The temperature-dependence of the output signal 22 is substantially eliminated by designing the FP laser 14 and the electroabsorption modulator 18 so that they have output wavelength and absorption edge temperature coefficient parity and they share a mutual thermal environment.

In some implementations, the FP laser 14 and the electroabsorption modulator 18 are designed so that the FP laser 14 has an output wavelength temperature coefficient that is substantially equal to the absorption edge wavelength temperature coefficient of the electroabsorption modulator 18. For example, in some implementations, the output wavelength temperature coefficient of the FP laser 14 and the absorption edge wavelength temperature coefficient of the electroabsorption modulator 18 are substantially equal (i.e., they differ by at most ±25%). In some implementations, this temperature coefficient parity is achieved by forming the FP laser 14 and the electroabsorption modulator 18 of materials selected from the same semiconductor material family. As used herein, the term "semiconductor material family" refers to a group of semiconductor materials that are composed of, for example, two or more members of a discrete set of suitable elemental atoms (e.g., Group III and Group V elemental atoms) suitable for forming an epitaxial thin film a compatible substrate. Exemplary semiconductor material families include: $In_x Ga_{1-x}As_y P_{1-y}$ on an InP substrate, where $0 \leq x \leq 1$ and $0 \leq y \leq 1$; $Al_x Ga_y In_{1-x-y}As$ on an InP substrate, where $0 \leq x \leq 1$ and $0 \leq y \leq 1$; $In_x Ga_{1-x}As$ on a GaAs substrate, where $0 \leq x \leq 1$; and $Al_x Ga_{1-x}As$ on a GaAs substrate, where $0 \leq x \leq 1$.

In addition to output wavelength and absorption edge temperature coefficient parity, the FP laser 14 and the electroabsorption modulator 18 share a mutual thermal environment such that the FP laser 14 and the electroabsorption modulator 18 are at substantially the same temperature throughout the range of operating conditions specified for the light source 10. For example, in some implementations, the FP laser 14 and the electroabsorption modulator 18 differ in temperature by at most 15 degrees Celsius (° C.) over an operating temperature range of 20° C. to 90° C.

As explained in detail below, the components of light source 10 may be packaged separately but contained within a shared thermal environment, or the components of light source 10 may be packaged in a single package that defines a shared thermal environment.

Figure 8A:
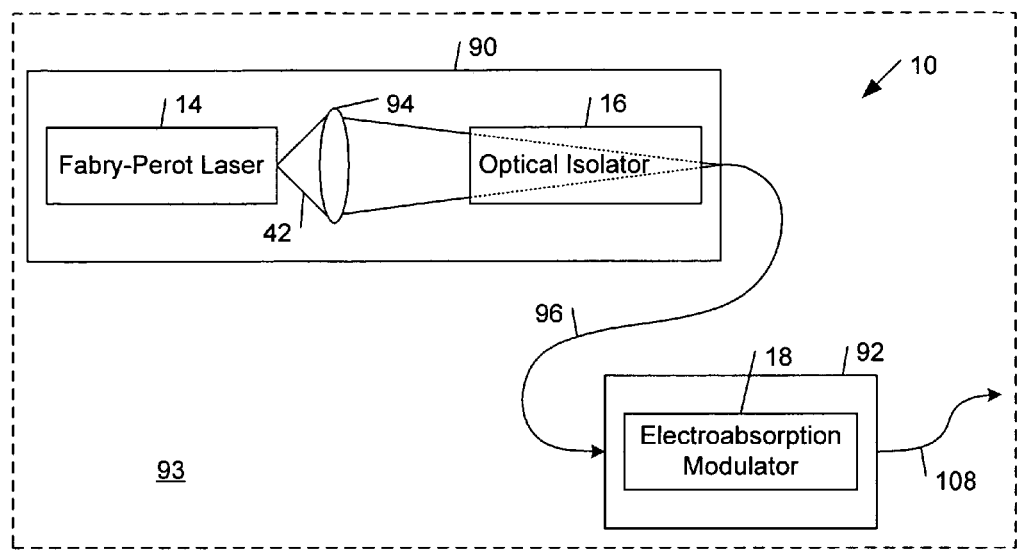
FIG. 8A is a block diagram of an implementation of the light source of FIG.
Figure 8B:
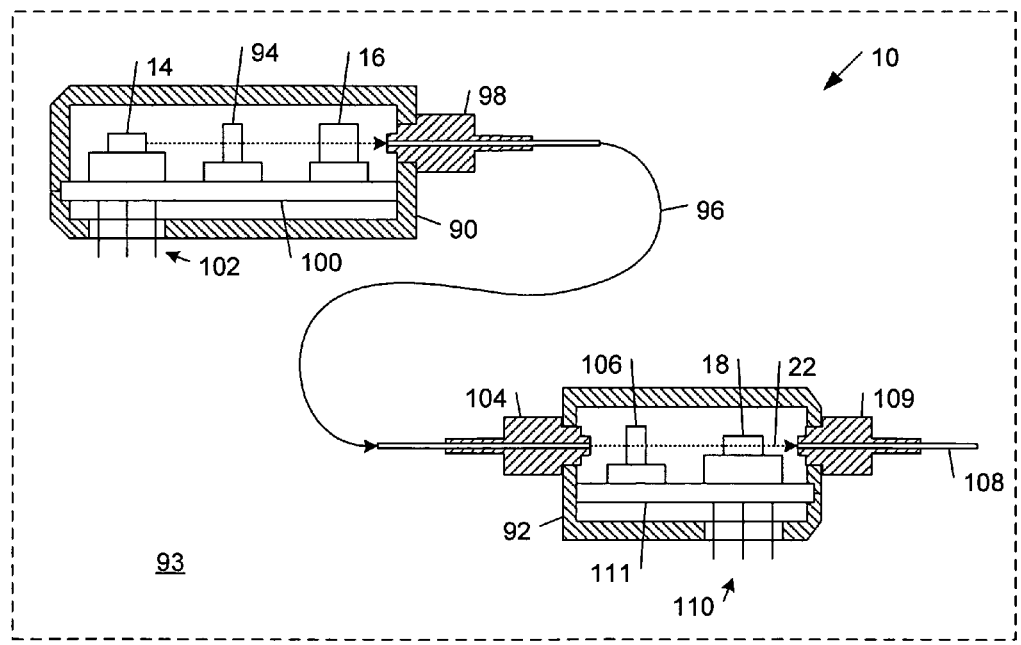
FIG. 8B is a diagrammatic side view of the light source implementation of FIG. 8A.

FIGS. 8A and 8B show an implementation of the light source 10 in which the Fabry-Perot laser 14 and the optical isolator 16 are contained within an optoelectronic package 90 and the electroabsorption modulator 18 is contained within a separate optoelectronic package 92, where both optoelectronic packages 90, 92 are contained within a shared thermal environment 93. A lens element 94 (e.g., an optical lens or a diffractive lens) focused the output light 42 from the FP laser 14 through the optical isolator 16 and onto the end of an optical fiber 96, which is held by a ferrule 98. The FP laser 14, the lens element 94, and the optical isolator 16 are mounted on a substrate 100 within the first optoelectronic package 90. Optical bench alignment techniques are used to align these components before they are secured to substrate 100. The FP laser 14 electrically connects to the drive circuit 12 through an electrical interface 102. In the implementations illustrated FIG. 8A and FIG. 8B, a high degree of flexibility is achieved by using a polarization-independent electroabsorption modulator 18.

A ferrule 104 holds the end of optical fiber 96 in optoelectronic package 92. In another embodiment, ferrule 104 holds the end of a separate fiber that can be connected to optical fiber 96. A lens element 106 (e.g., an optical lens or a diffractive lens) within the second optoelectronic package 92 focuses light received from the optical fiber 96 onto the input of the electroabsorption modulator 18. An optical fiber 108, which is held by a ferrule 109, carries the output optical signal 22 from the output of the electroabsorption modulator 18. The electroabsorption modulator 18 and the lens element 106 are mounted on a substrate 111 within the second optoelectronic package 92. Optical bench alignment techniques are used to align these components before they are secured to substrate 111. The electroabsorption modulator 18 electrically connects to the drive circuit 12 through an electrical interface 110.

In some implementations, the first and second optoelectronic packages 90, 92 are mounted on the same printed circuit board (e.g., a motherboard or a daughterboard), which is contained in an enclosure of an optical data transmission system that defines the shared thermal environment 93. In other implementations, the first and second optoelectronic packages 90, 92 are mounted on different printed circuit boards that are contained in an enclosure of an optical data transmission system that defines the shared thermal environment 93. In one exemplary implementation of this type, one of the first and second optoelectronic packages 90, 92 is mounted on a motherboard and the other optoelectronic package is mounted on a daughterboard connected to the motherboard in the optical data transmission system enclosure. In another exemplary implementation of this type, the first and second optoelectronic packages 90, 92 are mounted on different respective daughterboards that are connected to the same motherboard in the optical data transmission system enclosure. In these implementations, the first and second optoelectronic packages are decoupled from any direct active temperature-regulating devices.

Figure 9A:
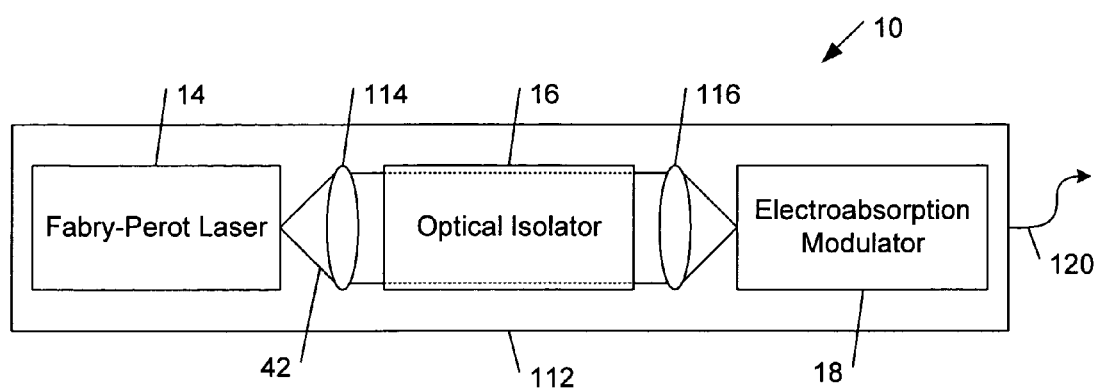
FIG. 9A is a block diagram of an implementation of the light source of FIG. 1.
Figure 9B:
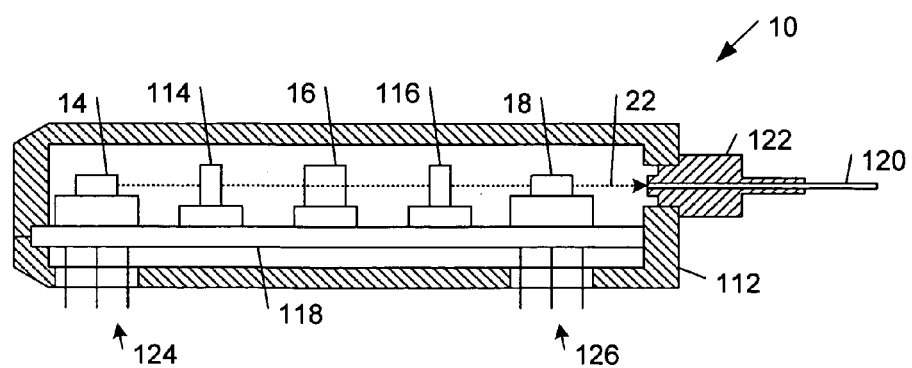
FIG. 9B is a diagrammatic side view of the light source implementation of FIG. 9A.

FIGS. 9A and 9B show an implementation of the light source 10 in which the Fabry-Perot laser 14, the optical isolator 16, and the electroabsorption modulator 18 are contained within the same optoelectronic package 112, which defines a shared thermal environment for the light source components. A lens element 114 (e.g., an optical lens or a diffractive lens) collimates the output light 42 from the FP laser 14. The collimated light passes through the optical isolator 16. A lens element 116 (e.g., an optical lens or a diffractive lens) focuses the light output from the optical isolator 16 onto the input of the electroabsorption modulator 18. The FP laser 14, the lens elements 114, 116, the optical isolator 16, and the electroabsorption modulator 18 are mounted on a substrate 118 within the optoelectronic package 112. Optical bench alignment techniques are used to align theses components before they are secured to substrate 118. An optical fiber 120, which is held by a ferrule 122, carries the output optical signal 22 from the output of the electroabsorption modulator 18. The FP laser 14 and electroabsorption modulator 18 electrically connect to the drive circuit 12 through respective electrical interfaces 124, 126.

Figure 10:
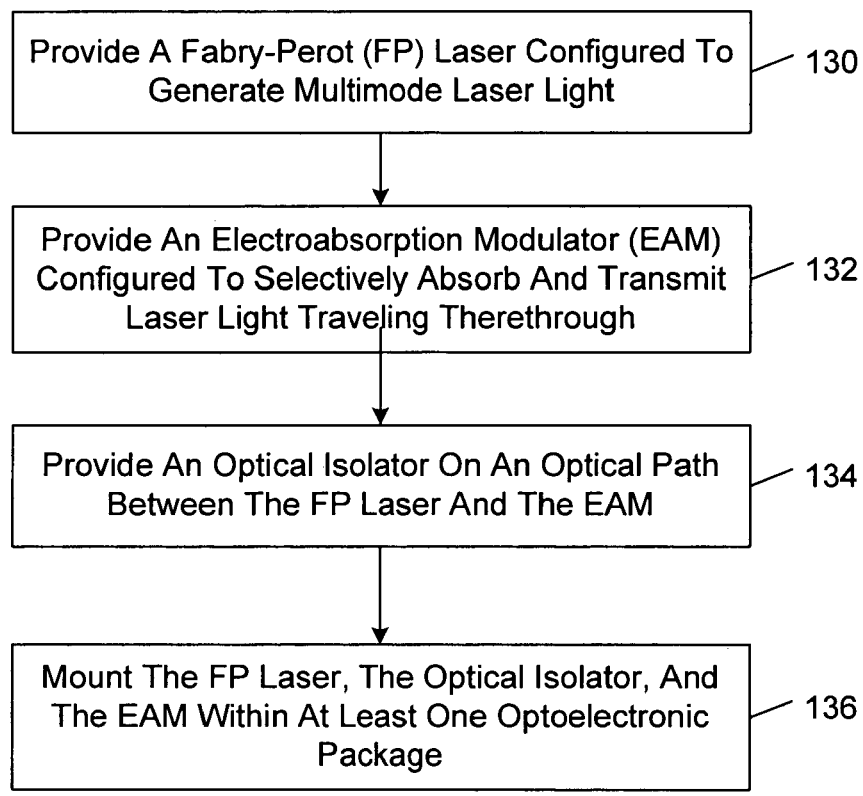
FIG. 10 is a flow diagram of a method of making the light source embodiment of FIG. 1.

FIG. 10 shows an embodiment of a method of making the light source 10. In accordance with this method, the FP laser 14 is provided (block 130). The electroabsorption modulator 18 is provided (block 132). The optical isolator 16 is provided (block 134). The FP laser 14, the optical isolator 16, and the electroabsorption modulator 18 are mounted in at least one optoelectronic package (block 136).

As a result of the above-described output wavelength and absorption edge temperature coefficient parity and the shared thermal environment, the relative wavelength offset between the center of the FP laser output spectrum 48 and the zero-bias absorption edge wavelength of the electroabsorption modulator 18 is substantially constant over a relatively wide temperature range (e.g., 20° C. to 90° C.). As a result, the insertion loss of the electroabsorption modulator 18 does not shift substantially with temperature since the respective band edges track and the optical output amplitude and the extinction ratio for a given electroabsorption modulator bias and signal amplitude are substantially temperature-independent.

The multimode spectrum of the optical signals 22 produced by light source 10 limits the distance over which the output optical signals 22 can propagate. The relatively broad spectral nature of the modulated output optical signals 22 still may be used over a range of useful distances for a number of practical optical data transmission applications. For example, output optical signals 22 with data rates up to approximately 40 Gb/sec are able to propagate up to approximately twenty meters on multimode optical fibers using, for example, a 2 nm root-mean-squared linewidth, 0 dBm of launched optical power, and a suitable receiver sensitivity. Among the applications for such short-distance data transmissions are high-speed signal transmission between computer chips, between printed circuit boards within a data transmission system, between back-planes, and between racks of separate data transmission systems.

Figure 11:
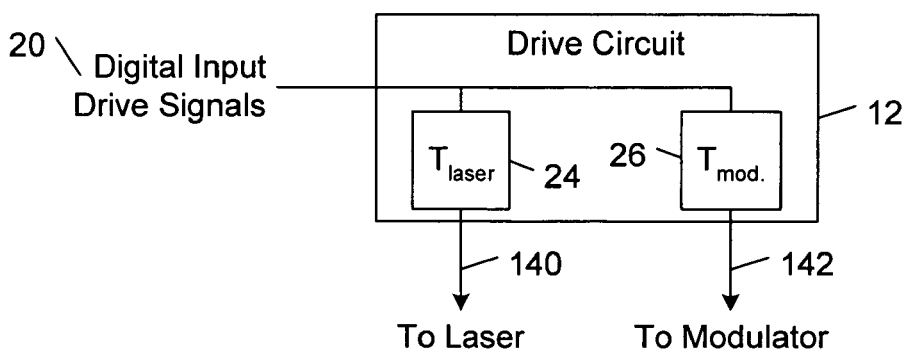
FIG. 11 is a block diagram of an embodiment of a drive circuit for driving the light source embodiment of FIG. 1.

FIG. 11 shows an embodiment of a drive circuit 12 for driving the light source 10. An external digital signal source, such as a non-return to zero (NRZ) driver, transmits digital input drive signals 20 to drive circuit 12. Drive circuit 12 includes respective sets 24, 26 of RF components (e.g., attenuators, filters, and couplers) that modify the digital input drive signals 20 with respective transfer functions $T_{laser}$, $T_{mod}$, and synchronously apply the drive signals 140, 142 to the FP laser 14 and the electroabsorption modulator 18. Drive circuit 12 also may include circuit elements for establishing appropriate direct current (DC) bias conditions for operating the FP laser 14 and the electroabsorption modulator 18.

Other embodiments are within the scope of the claims.

What is claimed is:

1. A modulatable light source, comprising:
a Fabry-Perot (FP) laser operable to generate multimode laser light, wherein the multimode laser light has a root-mean-square spectral line width of at most 3 nm;
an electroabsorption modulator (EAM) configured to selectively absorb and transmit the multimode laser light traveling therethrough such that the relative wavelength offset between a center of the FP laser output spectrum and the zero-bias absorption edge wavelength of the EAM is substantially constant over the temperature range from approximately 20° C. to 90° C.; and
an optical isolator on an optical path between the FP laser and the EAM and configured to transmit the multimode laser light traveling along the optical path from the FP laser to the EAM.

2. The light source of claim 1, wherein the multimode laser light has a root-mean-square spectral line of at most 1 nm.

3. A modulatable light source, comprising:
a Fabry-Perot (FP) laser operable to generate multimode laser light, wherein the multimode laser light has a wavelength temperature coefficient;
an electroabsorption modulator (EAM) configured to selectively absorb and transmit the multimode laser light traveling therethrough wherein the EAM has an absorption edge temperature coefficient equal to the wavelength temperature coefficient within ±25% over an operating range specified for the light source such that the relative wavelength offset between a center of the FP laser output spectrum and the zero-bias absorption edge wavelength of the EAM is substantially constant over the temperature range from approximately 20° C. to 90° C.; and
an optical isolator on an optical path between the FP laser and the EAM and configured to transmit the multimode laser light traveling along the optical path from the FP laser to the EAM.

4. A modulatable light source, comprising:
a Fabry-Perot (FP) laser operable to generate multimode laser light;
an electroabsorption modulator (EAM) configured to selectively absorb and transmit the multimode laser light traveling therethrough, wherein the FP laser and the EAM differ in temperature by at most 15° C. under operating conditions specified for the light source such that the relative wavelength offset between a center of the FP laser output spectrum and the zero-bias absorption edge wavelength of the EAM is substantially constant over the temperature range from approximately 20° C. to 90° C.; and
an optical isolator on an optical path between the FP laser and the EAM and configured to transmit the multimode laser light traveling along the optical path from the FP laser to the EAM;
wherein the light source is decoupled from any direct active-temperature-regulating device.

5. A method of making a modulatable light source, comprising:
providing a Fabry-Perot (FP) laser operable to generate multimode laser light, wherein the multimode laser light has a wavelength temperature coefficient;
providing an electroabsorption modulator (EAM) configured to selectively absorb and transmit the multimode laser light traveling therethrough wherein the EAM has an absorption edge temperature coefficient equal to the wavelength temperature coefficient within ±25% over an operating range specified for the light source such that the relative wavelength offset between a center of the FP laser output spectrum and the zero-bias absorption edge wavelength of the EAM is substantially constant over the temperature range from approximately 20° C. to 90° C.; and
providing an optical isolator on an optical path between the FP laser and the EAM and configured to transmit the multimode laser light traveling along the optical path from the FP laser to the EAM.

* * * * *

UNITED STATES PATENT AND TRADEMARK OFFICE
CERTIFICATE OF CORRECTION

| | | |
|---|---|---|
| PATENT NO. | : 7,502,567 B2 | |
| APPLICATION NO. | : 10/867853 | |
| DATED | : March 10, 2009 | |
| INVENTOR(S) | : Tirumala R. Ranganath | |

It is certified that error appears in the above-identified patent and that said Letters Patent is hereby corrected as shown below:

Column 9, Line 20, Claim 2, delete "line" and insert --line width--.

Signed and Sealed this
Eleventh Day of January, 2011

David J. Kappos
*Director of the United States Patent and Trademark Office*